United States Patent [19]

Destremps

[11] Patent Number: 5,477,223
[45] Date of Patent: Dec. 19, 1995

[54] FINGER ACTIVATED KEYBOARD FOR A COMPUTER

[76] Inventor: Gerald Destremps, 1152 Blair St., Sunnyvale, Calif. 94087

[21] Appl. No.: 928,898

[22] Filed: Aug. 12, 1992

[51] Int. Cl.⁶ .............................................. H03K 17/968
[52] U.S. Cl. .............................. 341/31; 341/22; 345/170; 250/221
[58] Field of Search ................................ 341/20, 22, 31; 345/167, 168, 170; 250/221; 400/477, 479

[56] References Cited

U.S. PATENT DOCUMENTS

| | | | |
|---|---|---|---|
| 3,372,789 | 3/1968 | Thiele et al. | 341/31 |
| 3,851,328 | 11/1974 | Sottile et al. | 341/31 |
| 3,886,544 | 5/1975 | Naroduy | 341/31 |
| 4,379,968 | 4/1983 | Ely et al. | 341/31 |
| 4,641,026 | 2/1987 | Garcia, Jr. | 341/26 |
| 4,655,621 | 4/1987 | Holden | 341/20 |
| 4,800,264 | 1/1989 | Vissiere | 341/31 |
| 4,931,794 | 6/1990 | Haag et al. | 341/31 |

FOREIGN PATENT DOCUMENTS

| | | | |
|---|---|---|---|
| 0665302 | 5/1979 | U.S.S.R. | 341/31 |
| 1443201 | 12/1988 | U.S.S.R. | 341/31 |

OTHER PUBLICATIONS

IBM Technical Disclosure Bulletin, vol. 27, No. 10B, Mar. 1985, "Mouse/Keyboard Concept Incorporating Unique Devices for Controlling CRT display cursors".

Primary Examiner—John K. Peng
Assistant Examiner—Daniel J. Wu
Attorney, Agent, or Firm—Robert S. Smith

[57] ABSTRACT

A keyboard in which each key includes a light source and photodetector in a region such as a depression in a panel. The key signal is activated by inserting the finger into the depression so as to interrupt the beam. In one embodiment, the depressions are molded into a plastic surface. In another embodiment, the key support structure is a pair of closely spaced parallel panels. An array of key holes are formed in in one panel. An array of detecors and light sources is mounted on the second panel such that when the panels are assembled together, a light source detector pair is located with each key hole providing that the beam between the light source and photodetector will be interrupted when the user inserts his finger in the hole. In another embodiment, the key board has a pyramidal shape and armrests are provided to reduce repetitve motion stress. In a further modification, the pyramidal keyboard is provided with a computer ball so that the ball can be moved at the same time that varioosu combinations of keys are depressed to perform a selected one of a number of operations such as measuring the length of a line, coloring in an enclosure, etc.

9 Claims, 3 Drawing Sheets

FINGER ACTIVATED KEYBOARD FOR A COMPUTER

BACKGROUND

1. Field of the Invention

This invention relates to keyboards for computers and particularly to a keyboard with an array of light emitters and photodiodes arranged for interception of light beams by the fingers.

2. Prior Art and Information Disclosure

A major public health problem emerging with increasing use of the computer is repetitive motion stress syndrome which develops in a user as a result of long hours operating the keyboard. The problem is characterized by soreness of the joints in the fingers, hands and wrists. Severe onset of this condition can often only be remedied by an operation to open the carpal tunnel. Numerous devices have appeared on the market to relieve this source of stress.

One group of these devices has been directed toward support for the wrists and hands while performing the typing operation (see, e.g., U.S. Pat. No. 5,131,614 to Garcia, et al).

Another group of devices is directed toward uniquely shaped keyboards in which combinations of keys are depressed simultaneously to type the various characters. This arrangement is intended to enable the user to position his hands and wrists in the most relaxed position while operating the keys and reduce the distance that the user's hands must be moved in order to operate the keyboard (see, e.g., The BAT chordal keyboard from Infogrip Inc., Baton Rouge, La.).

Another group of inventions is directed toward electrically actuated keys that require less operating force than the oldstyle typewriter keys. A number of these inventions disclose arrays of photo diodes and light emitters in which the character is selected by depressing a key which interposes a barrier, aperture, or deflector into the path of the light beam. For example U.S. Pat. No. 3,579,047 is for a keyboard in which each key has one or more barriers. Each barrier, in one position of the key is a barrier to one of a plurality of light beams such that depression of a key or combination of keys generates a coded message.

U.S. Pat. No. 3,758,785 is for a key and keyboard housing comprising a light source and detector associated with each key and mounted in the housing such that depression of the key interrupts the associated beam.

U.S. Pat. No. 4,379,968 and Reissue 33,422 are for a matrix of rows and columns of apertures, each arranged to slide by depression of a key to a position where it admits or interrupts light beams radiated toward a corresponding detector.

U.S. Pat. No. 4,860,008 discloses a keyboard comprising a plurality of keys arranged in rows and columns, a deflector associated with each key, a radiation emitter for each column, and a detector for each column—all arranged such that deflection of a key deflects the light beam from the corresponding column to the detector in the corresponding row.

U.S. Pat. No. 4,980,685 is for an array of colomns and rows of key operated light valves wherein interconnection between the members of the array is accomplished with optical fibers.

Each valve includes a sliding barrier that is interposed between opposing ends of a pair of optical fibers.

Each of these inventions involves depression of a key, thereby inherently requiring some application of force. Furthermore, the cost of manufacturing the keyboard must also include the cost of the individual keys and the associated actuating mechanisms.

THE INVENTION

Objects

It is an object of this invention to provide a keyboard in which the activation of the keys requires minimal force on the fingers.

It is another object to minimize cost of manufacturing the keyboard.

It is another object to avoid any requirement for moving parts that would result in wear.

It is another object to reduce the requirement for hard wiring.

It is another object to activate the selected key by interrupting a light beam in an array of light beams.

Summary

This invention is directed toward a keyboard in which each key location is a region in a support structure into which the user inserts a finger in order to modify one or more light beams of an array of light beams. Each light beam or combination of light beams activates a photodetector in an array of photodetectors so that interruption of the beam (singly or in combination) elicits a signal in the corresponding photodetector (either singly or in combination). The elicited signal represents a symbol such as an alphanumeric character or punctuation mark such as are found on the typical keyboard.

In one embodiment, the support structure is a panel having a surface with an array of depressions, each depression constituting one of the regions.

In another embodiment, the support structure is a pair of parallel panels. The top panel has an array of holes, each hole corresponding to a key. The bottom panel is a circuit board with the photodectors, light sources mounted on the board and arranged in association with the array of holes in the top panel and other components mounted on the board and circuitry etched in the board.

DRAWINGS

DESCRIPTION OF THE BEST MODE

The following descriptions present several variations of this invention including what I presently believe to be the best mode for carrying out the invention.

Figure 1:
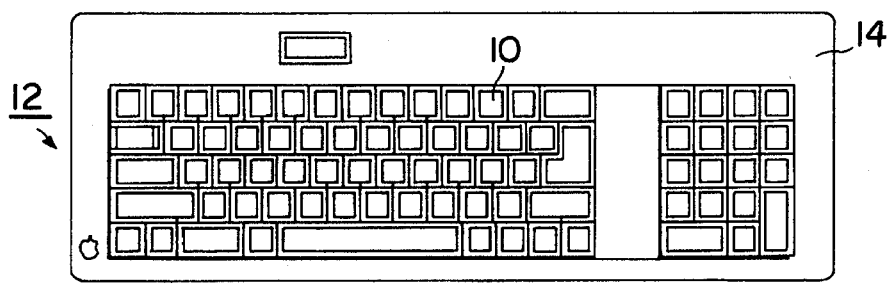
FIG. 1 is a top view showing the key layout of the typical keyboard of the prior art.

Turning now to a discussion of the drawings, FIG. 1 shows the arrangement of keys 10 for a typical keyboard 12 of the prior art. In the present invention the arrangement of the keys may be identical to FIG. 1. In the context of this applications, the term "key region" or "key" when used in identical to FIG. 1. In the context of this applications, the term "key region" or "key" when used in the following description of the various embodiments is defined as a region in a support structure with an associated light source and photodetector.

Figure 2:
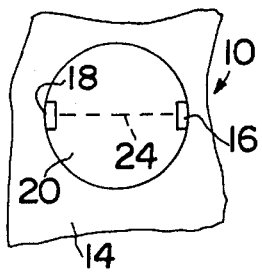
FIG. 2 is a top view showing the key construction of the present invention.
Figure 3:
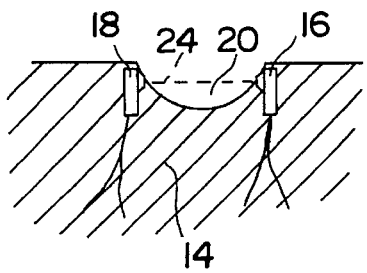
FIG. 3 is a side sectional view of FIG. 2.

FIG. 2 is a top view and FIG. 3 is a side view of a single key 10 of this invention in which the region is a depression 20 in the surface of the support structure 14. (The support structure is cutaway in FIGS. 2 and 3 so that only one key 10 is shown.) There are shown a photodetector 18 and a light source 16 on opposite sides of depression 20 so that the operator activates the key by inserting his finger into the depression 20 thereby interrupting the light beam 24.

In the embodiment illustrated in FIGS. 2 and 3, the photodetector 18 may be a model number SDP8406 manufactured by the Honeywell Corporation. The light source 16 is a "GaAs infrared emitting diode" model number SEP8506 also manufactured by the Honeywell Corporation.

Figure 4:
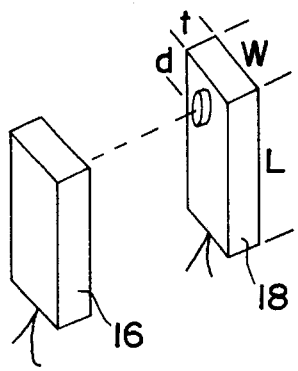
FIG. 4 is a perspective view showing the detector and light source separated from the keyboard panel.

FIG. 4 shows the Honeywell detector and light source separated from the keyboard and opposing one another in order to illustrate relative dimensions for these particular models. Dimensions of the detector and emitter are as follows: w=0.176 in. t= 0.090 in. h= 0.225 in. d= 0.045 in.

d is the distance from the top edge of the device to the center of the detection and emission areas as shown in FIG. 3. When using the Honeywell devices listed above, the depth of the depression would typically be 0.090 inches.

Figure 5:
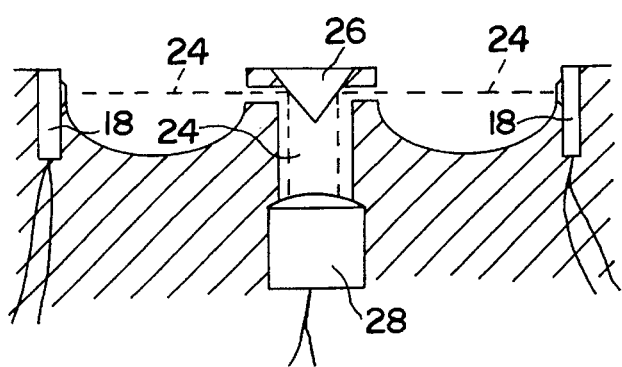
FIG. 5 is a side sectional view showing one light source providing a beam for two keys.

The embodiments of FIGS. 2 and 3 show one detector and one light source for each key. Other arrangements may be contemplated which reduce the number of detectors and/or light sources. For example, FIG. 5 shows an arrangement which incorporates a two-way split reflector prism 26 positioned above light source 28. The prism 26 splits and reflects the beam 24 to detectors 18. For this embodiment, a GaAs light emitting diode may be used such as SE3450/5450 manufactured by the Honeywell Corp.

Figure 7A:
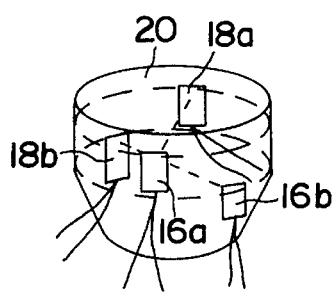
FIG. 7a is a perspective view showing two detector-source pairs in each key, one pair at one level and the other pair at another level.

FIG. 7a shows a key construction in which two pairs of detectors 18a, 18b and light sources 16a, 16b are incorporated into each key region. One detector-source pair (16a, 18a) is located at a lower level in the depression 20 with respect to the top surface of the support structure and the other detector-source pair is (16b, 18b) is located at an upper level in the depression 20.

Figure 7B:
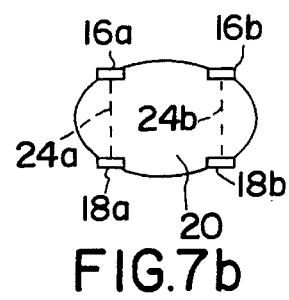
FIG. 7b shows two pairs of light source-detectors located in separate areas of the key rgion.

An alternative construction to accomplishing the objective of the feature shown in FIG. 7a is shown in FIG. 7b where one one source-detector pair 16a, 18a is shown placed in one area of the key region 20 and another source-detector pair 16b, 18b is placed in another area of the key region. This arrangement permits that two separate key signals may be elicited by simply moving the finger sideways from one area to the other to interrupt either of beams 24a or 24b.

This construction provides that either one of two characters may be selected simply by inserting the finger to one depth in the depression to interrupt only the beam from the upper source or inserting the finger deeper in the depression to interrupt the beams from both the upper light source and the lower light source.

Figure 8:
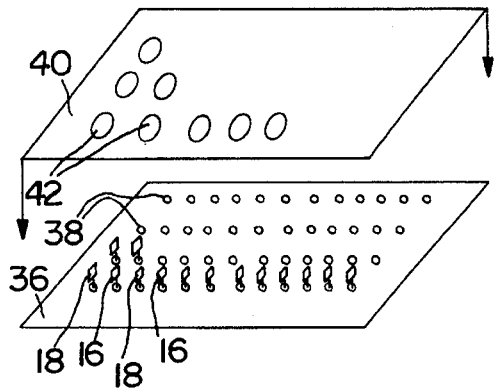
FIG. 8 is a perspective view of another embodiment of this invention in which the keyboard support structure comprises a bottom panel stuffed with an array of detectors and light sources and an upper panel with a corresponding array of holes into which the user inserts his fingers to activate the keys.

FIG. 8 is an exploded perspective of view another embodiment in which the support structure includes a lower panel 36 with mounting holes 38 arranged to receive the photodetectors 18 and light sources 16. Photodetectors 18 and light sources 16 are not shown in some locations in order to illustrate the mounting holes 38. An upper panel 40 is positioned on top of the lower panel 36 supporting the source-detector array with holes 42 (instead of depressions) where the user inserts his finger to interrupt the light beam. An advantage of the arrangement shown in FIG. 8 is that the lower panel may be a printed circuit board with etched circuitry and mounted components such as integrated circuit chips 46, resistors, etc. (Printed circuitry, IC's and other components are not shown on panel 36 in FIG. 8.)

Figure 6:
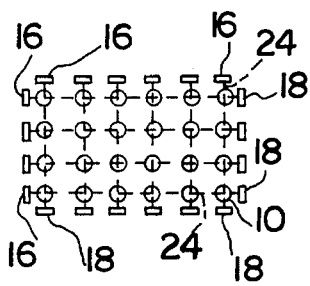
FIG. 6 is a top view showing a matrix of rows and columns of light beams, thereby reducing the number of required light sources and detectors.
Figure 16:
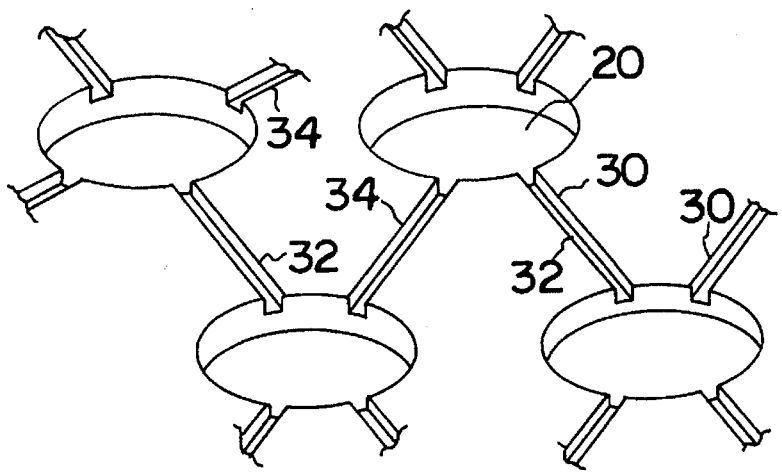
FIG. 16 shows channel construction for the matrix array of light beams shown in FIG. 6.

FIG. 6 shows an embodiment including a matrix of light sources 16 and detectors 18 such that a beam 24 from each one light source 16 passes through columns and rows of depressions 20. This arrangement may be used with either of the support structures described above. When used with the support structure featuring depressions in the surface of a panel, then, in addition to the depressions, the top surface of the keyboard has a rectangular network of channels (see FIG. 16) forming parallel rows 32 intersecting parallel columns 34. When used with the support structure featuring a top and bottom panel, the rows and columns of light beams pass between the two panels. In either construction, one detector 18 sends a beam 24 down one row 32 or column 34 respectively. Each row or channel has a photodetector 18 for detecting the respective beam. When the finger is inserted in the key region 10, two beams 24 are interrupted as detected by a photodetector at the end the row and a photodetector at the end of column. Therefore, only M+ N photodetectors and light sources are required where M is the number of of rows and N is the number of columns.

Figure 9:
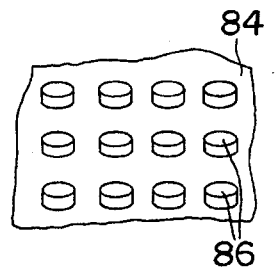
FIG. 9 shows a temporary insert used in encapsulating the double panel construction of FIG. 8.

A variation of the double panel construction shown in FIG. 8 is to encapsulate the components and circuitry contained in the space between the upper and lower panels. This is accomplished with the use of an insert panel 84 shown in FIG. 9 which is positioned with the inserts 86 positioned through the holes 42 (FIG. 8) of the upper panel 40 during the encapsulating process thereby creating the depressions for the key regions.

Figure 10:
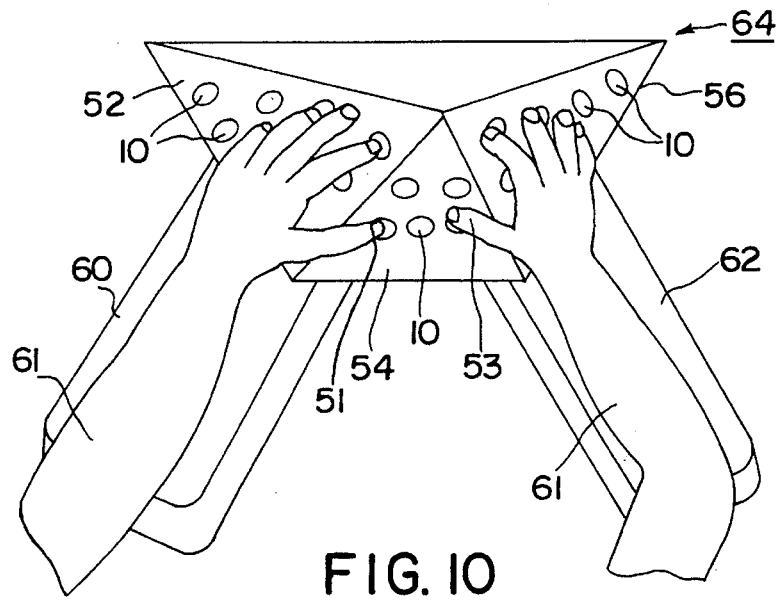
FIG. 10 shows the position of the hands on a pyramid keyboard.

In the embodiments discussed supra, the keys of the keyboard are arranged in a flat plane. Actually, arrangement of the keys in a flat plane is not the most effective configuration for relaxing the wrists. A more relaxed position is one where the elbows are bent, the forearms supported and the palms of the hands turned toward one another. A keyboard configuration that provides a better accomodation to this position of the hands is shown in FIG. 10. The keys 10 of this invention are mounted on the three lateral sides 52, 54 and 56 of a pyramid oriented at an oblique angle to the base (base not shown in FIG. 10). The right and left forearms 61 rest on right and left forearm supports 60 and 62 respectively. The keyboard pyramid 64 is located between the hands such that the fingers of the right and left hand are proximal to pyramidal surfaces 52 and 56 respectively. Both right and left thumbs 51 and 53 are proximal to the keys on pyramid surface 54.

Figure 11A:
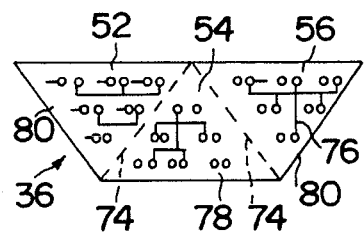
FIG. 11 shows a method for constructing the pyramid support structure with two parallel panels.
Figure 11B:
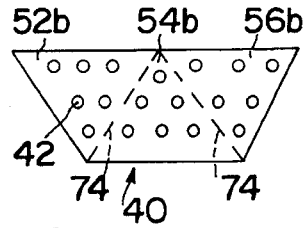

The advantage of the pyramidal construction is not only that it accomodates the natural position of the hands but also that each flat oblique side can have the same parallel panel construction as shown in FIG. 8. As shown in FIG. 11, the bottom panel 36 is precut with flexible joints 74 joining the triangular panel sections 52, 54 and 56. In this flat preformed condition, printed circuitry 76 and component holes 78 may be formed in the various panel sections 52, 54 and 56. Then the lower panel 36 is bent along the flexible joints (dotted lines) 74 and secured along the joining lines 80 to another oblique panel and a base panel (not shown) to form the bottom pyramid of the pyramidal keyboard. Then a second panel 40 is drilled with key holes 42 and which also has flexible joint 74 (dotted lines).

Panels 36 and 40 are folded and joined with an additional oblique panel and base panel then assembled such that top panel 40 with key holes 42 is positioned over lower panel 36 supporting the circuitry thereby forming the pyramid keyboard shown in FIG. 10.

Figure 12:
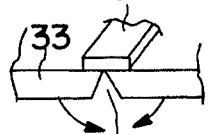
FIG. 12 shows construction of the flexible joint of the pyramid keyboard.

Construction of the flexible joint 74 can be formed in the same operation as when the circuitry is etched into the panel as illustrated in FIG. 12. There is shown a copper strip 31 and a notch 29 in the plastic substrate 33. The arrows indicate bending of the joint to form the pyramid.

Figure 13:
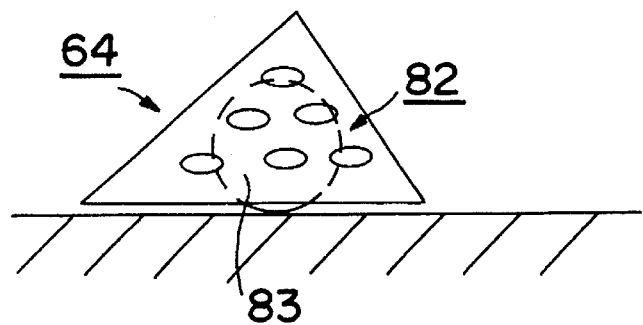
FIG. 13 shows the pyramidal support structure with a ball assembly mounted inside the support structure with the surface of the ball partially protruding from the base panel to perform operations by simultaneously rolling the ball and depressing selected combinations of keys.

A variation of the pyramidal construction is shown in FIG. 13. A ball assembly 82 is located inside the keyboard pyramid 64 including a ball 83 which can be rolled on a base 85 to move the pointer on the computer screen as is accomplished with the "mouse" in well known computer art except that the user may move the ball without lifting the hands from the keyboard thereby enabling him to perform certain unique operations. In the context of this specification, the word "operation" is defined as meaning presenting on the screen of a computer any combination of lines and figures controlled by simultaneous motion of a ball of ball assembly 82 and selective activation of the keys 10. In the context of this specification, the term, "ball assembly" is to be understood as meaning a ball and its means of support and associated circuitry that is well known in computer technology for moving a cursor around on a computer screen.

This feature has major advantages with regard to speeding the operation of the key board. Another advantage of this construction is that by depressing certain combinations of keys while moving the ball, certain operations could be performed depending on which combination of keys is depressed while the ball is moving.

For example, one combination of depressed keys could result in a line being drawn on the screen.

Another combination of keys could result in drawing a dotted line on the screen.

Another combination of keys could be used to measure and display the length of the line as it is being drawn. This feature would be particularly useful when it is desired to know the length of a curved line.

Another combination of keys could be used to color an enclosure.

The foregoing paragraphs describe a number of embodiments that meet the objects of the invention. The crux of the invention is a support structure for defining discrete regions, each region having a light source sending at least one light beam from one side of the region to a detector on another side of the region. The user generates a signal indicating the selected character by simply inserting his finger into the region thereby modifying the beam. The support structure may be a panel with depressions or a panel with holes as described above. The panel may be flat or have another configuration such as the pyramid described and combined with arm rests.

Figure 14:
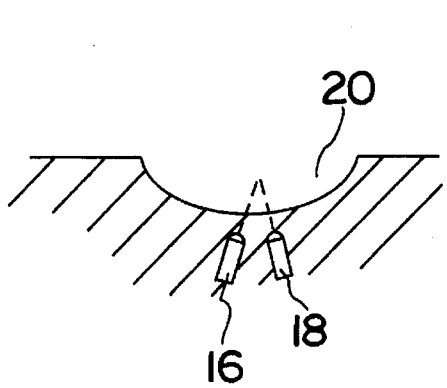
FIG. 14 shows an embodiment in which the active element of the key is a reflection assembly activated by light reflecting from the finger to the detector.
Figure 15:
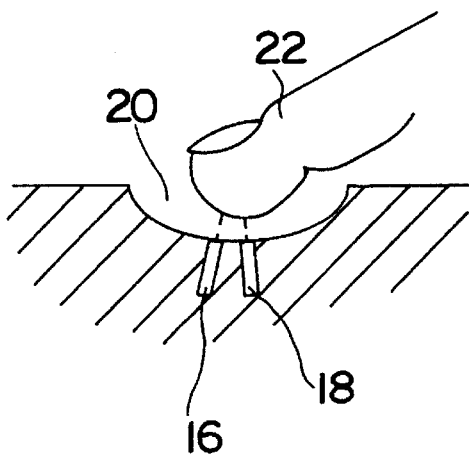
FIG. 15 shows the key of FIG. 14 with the finger proximal to the key.

Other embodiments may be contemplated such as inserting the finger into the key region to modify the beam in any manner that is detectable by a photodetector. This includes an arrangement as shown in FIG. 14 in which the photodetector 18 and light source 16 are arranged side by side such that light emitted by the light source 16 does not shine directly on the photodetector 18 but is reflected onto the photodetector 18 when the finger 22 is placed proximal to the light source 16 as shown in FIG. 15. A "reflective assembly" including a photodetector adjacent to a light source as shown in FIGS. 14 and 15 is manufactured as part number HOA708/709 by the Honeywell Corp.

Other embodiments would also include various arrangements of the keys, circuits that scan the array of detectors, etc., which are embodiments of the invention.

I therefore wish to define the scope of my invention by the appended claims and in view of the specification if need be.

I claim:

1. A keyboard for eliciting any selected one signal of a plurality of signals, each said signal corresponding to one symbol of a group of symbols, which comprises:

a support structure means having a surface for defining a plurality of key regions, each key region being a depression in said surface;

a plurality of pairs, each pair being one photodetector paired with one light source;

each said depression having a bottom surface and two of said plurality of pairs of a photodetector and light source located within each depression, one of said two pairs located at a first level with respect to said bottom surface and another one of said two pairs located at a second level with respect to said bottom surface and operably arranged such that one signal is elicited when said user's finger is inserted into said depression to said first level and another signal is elicited when said finger is inserted into said depression to said second level.

2. A keyboard for eliciting any selected one signal of a plurality of signals, each said signal corresponding to one symbol of a group of symbols, which comprises:

a support structure means having a surface for defining a plurality of key regions, each key region being a depression in said surface;

a plurality of pairs, each pair being one photodetector paired with one light source;

each light source arranged to shine a light beam on its paired photodetector and provided with means for eliciting a respective one of said signals when said light beam is interrupted;

two pairs of said photodetector and light source positioned in each depression, one pair positioned in one area of said depression and said other pair positioned in another area of said depression providing that two separate signals may be elicited by inserting a finger in one said area and said another area.

3. A keyboard having keys for eliciting any selected one signal of a plurality of signals, each said signal corresponding to one symbol of a group of symbols, which comprises:

a first panel means having a surface for supporting a plurality of pairs, each said pair being a photodetector and light source;

each said light source arranged to send a light beam through a respective one key region of a plurality of key regions and incident on its respective photoconductor;

a second panel substantially parallel to said surface having holes arranged in operable combination with said first panel means and said photodetectors and light sources for defining key regions, each said key region corresponding to one of said keys, respectively;

said plurality of photodetectors and light sources arranged in operable combination with one another and said key regions of said support structure to permit a user to insert a finger into a selected one of said key regions thereby modifying a respective one of said light beams from said plurality of light sources causing at least one photodetector of said plurality of photodetectors to elicit one of said plurality of signals; and wherein a space between said first and second panels is encapsulated.

4. A keyboard as in claim 3 which comprises means for supporting forearms of a user while operating said keyboard.

5. A keyboard for eliciting any selected one signal of a plurality of signals, each said signal corresponding to one symbol of a group of symbols, which comprises:

a support structure being a pyramidal structure having at least four sides including a first oblique side, a second oblique side and a third oblique side and a base side wherein said oblique sides have a plurality of key regions;

each key region being a depression in said contoured surface and associated with one of said signals;

a plurality of light sources supported by said support structure means, each said light source arranged to send a light beam through at least one of said regions;

a plurality of photodetectors supported by said support structure means, each said photodetector arranged to detect modification of at least one of said light beams;

said plurality of photodetectors and light sources arranged in operable combination with one another and said key regions of said support structure to permit a user to insert a finger into a selected one of said key regions thereby modifying at least one light beam from said plurality of light sources causing at least one photodetector of said plurality of photodetectors to elicit one of said plurality of signals.

6. A keyboard as in claim 3 wherein each said light source comprises a light emitting diode.

7. A keyboard as in claim 3 wherein each said photodetector comprises a phototransistor.

8. A keyboard as in claim 3 wherein each said light source is a light emitting diode.

9. A Keyboard as in claim 3 wherein each said photodetector is a phototransistor.

* * * * *